US012586763B2

(12) United States Patent
Kumagai et al.

(10) Patent No.: US 12,586,763 B2
(45) Date of Patent: Mar. 24, 2026

(54) SHOWER HEAD ELECTRODE ASSEMBLY AND PLASMA PROCESSING APPARATUS

(71) Applicant: Tokyo Electron Limited, Tokyo (JP)

(72) Inventors: Ryosuke Kumagai, Miyagi (JP); Hidetoshi Hanaoka, Miyagi (JP); Fumiaki Ariyoshi, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 512 days.

(21) Appl. No.: 17/987,490

(22) Filed: Nov. 15, 2022

(65) Prior Publication Data

US 2023/0158517 A1    May 25, 2023

(30) Foreign Application Priority Data

Nov. 22, 2021    (JP) ................................. 2021-189273

(51) Int. Cl.
*H01J 37/32*        (2006.01)

(52) U.S. Cl.
CPC .... *H01J 37/3244* (2013.01); *H01J 37/32532* (2013.01)

(58) Field of Classification Search
CPC ............. H01J 37/3244; H01J 37/32532; H01J 37/32091; H01J 37/32449; H01J 37/32541; H01J 37/32568; H01J 37/3255; H01J 37/32623; H01J 15/00; H01J 37/32082; H01J 37/32009; C23C 16/45561; C23C 16/507; C23C 16/509; C23C 16/5096; C23C 16/45565; H01L 21/67069

USPC .......... 118/715, 723 E, 723 ER; 156/345.33, 156/345.34, 345.43, 345.44, 345.45, 156/345.46, 345.47
See application file for complete search history.

(56) References Cited

U.S. PATENT DOCUMENTS

| | | | |
|---|---|---|---|
| 6,942,753 B2 * | 9/2005 | Choi | ................. C23C 16/45565 |
| | | | 156/345.33 |
| 7,108,751 B2 * | 9/2006 | Strang | ................. H01J 37/3244 |
| | | | 118/712 |
| 7,481,886 B2 * | 1/2009 | Kato | ................. C23C 16/45565 |
| | | | 156/345.33 |
| 9,082,593 B2 * | 7/2015 | Hayashi | ................. C23C 16/503 |
| 2003/0170388 A1 * | 9/2003 | Shinriki | ................. C30B 25/14 |
| | | | 257/E21.272 |

(Continued)

FOREIGN PATENT DOCUMENTS

| | | |
|---|---|---|
| JP | 2006-303263 A | 11/2006 |
| JP | 2010-514160 A | 4/2010 |

(Continued)

*Primary Examiner* — Rudy Zervigon
(74) *Attorney, Agent, or Firm* — XSENSUS LLP

(57) ABSTRACT

There is provided a shower head electrode assembly of a plasma processing apparatus, comprising: an electrode having a plurality of first gas flow paths and having a surface exposed to plasma; and a backing member attached to the electrode and having a plurality of second gas flow paths which communicate with the plurality of first gas flow paths. Each of the plurality of second gas flow paths is a slit-shaped elongated hole, and is configured such that a length of the elongated hole in radial direction is longer than a length of the elongated hole in circumferential direction with respect to a central axis of the shower head electrode assembly.

15 Claims, 7 Drawing Sheets

(56)     References Cited

U.S. PATENT DOCUMENTS

| 2005/0178748 A1* | 8/2005 | Buchberger, Jr. ............................ H01J 37/32183 219/121.48 |
| 2008/0141941 A1* | 6/2008 | Augustino ........ H01J 37/32541 438/758 |
| 2008/0302303 A1* | 12/2008 | Choi ................. C23C 16/45565 438/758 |
| 2015/0107772 A1* | 4/2015 | Uchida ............. C23C 16/45565 156/345.33 |
| 2015/0345020 A1* | 12/2015 | Tucker ................ C23C 16/4412 118/723 R |

FOREIGN PATENT DOCUMENTS

| JP | 2012-199428 A | 10/2012 |
| KR | 10-2009-0094379 A | 9/2009 |
| WO | 2008/076408 A1 | 6/2008 |

* cited by examiner

13Bh1  13Ah  13Bh2

13Ah2

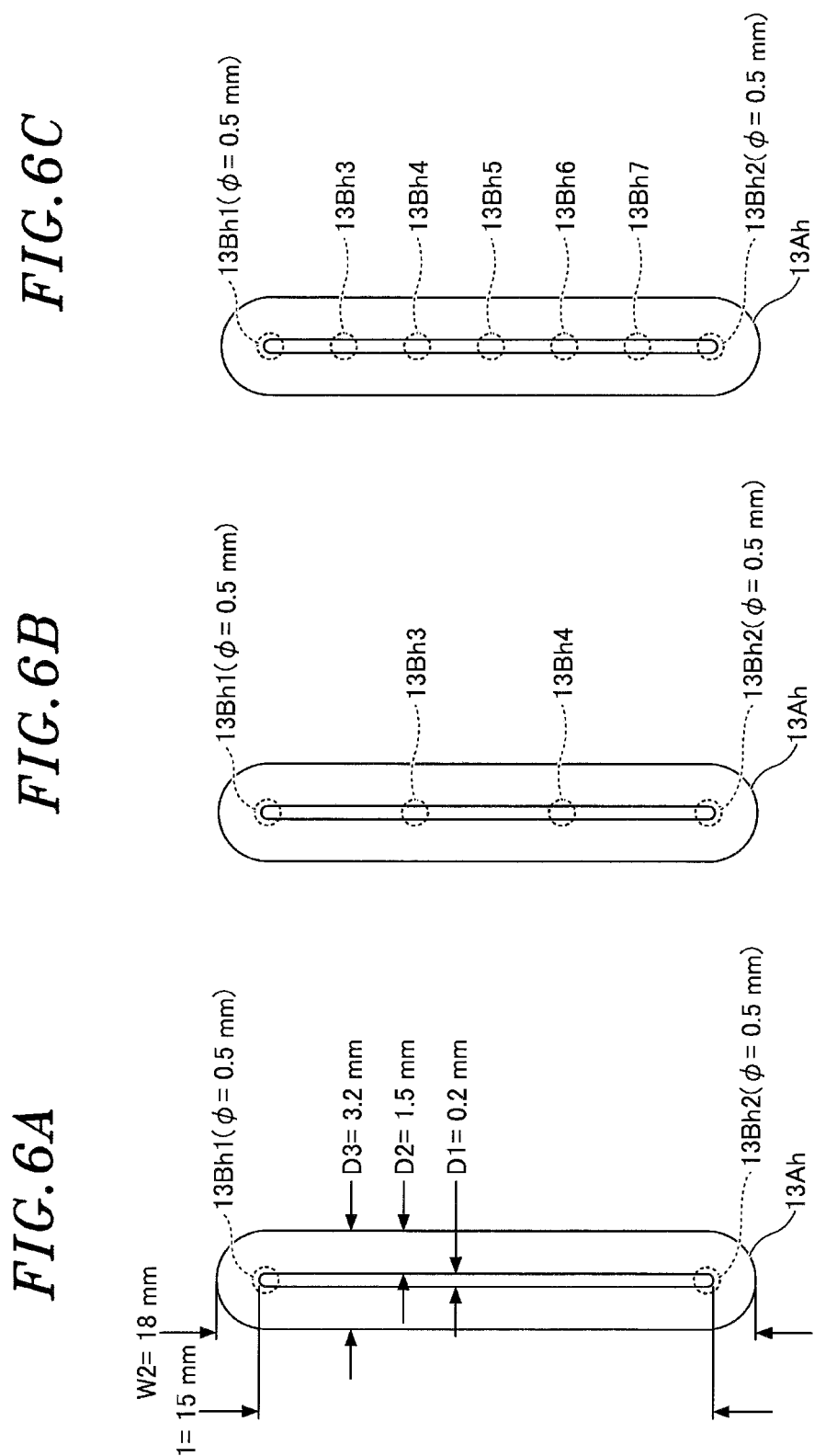
*FIG.6A*     *FIG.6B*     *FIG.6C*

| | PRESSURE (Torr) | | |
|---|---|---|---|
| | Center | Middle | Edge |
| P4 | 4.16 | 4.16 | 5.33 |
| P3 | 3.07 | 3.07 | 3.93 |
| P2 | 2.63 | 2.63 | 3.36 |
| P1 | 0.017 | | |

| | PRESSURE (Torr) | | |
|---|---|---|---|
| | Center | Middle | Edge |
| P4 | 4.09 | 4.09 | 5.23 |
| P3 | 2.17 | 2.17 | 2.78 |
| P2 | 1.86 | 1.86 | 2.38 |
| P1 | 0.017 | | |

SHOWER HEAD ELECTRODE ASSEMBLY AND PLASMA PROCESSING APPARATUS

CROSS-REFERENCE TO RELATED APPLICATIONS

This application claims priority to Japanese Patent Application No. 2021-189273 filed on Nov. 22, 2021, the entire contents of which are incorporated herein by reference.

TECHNICAL FIELD

The present disclosure relates to a shower head electrode assembly and a plasma processing apparatus.

BACKGROUND

In a plasma processing apparatus, a shower head that supplies a processing gas into a processing chamber from a plurality of gas flow paths is used. For example, Japanese Laid-open Patent Publication No. 2010-514160 discloses a shower head which includes a first member attached to a second member, the first and second members having first and second gas flow paths in fluid communication. It is disclosed that when the processing gas flows through the gas flow path in such a shower head, a total pressure drop occurs along the first and second gas flow paths, and a rate of total pressure drop along the second gas flow path is greater than a rate of total pressure drop along the first gas flow path.

SUMMARY

The present disclosure provides a technology for preventing abnormal discharge that occurs inside a shower head.

In accordance with an aspect of the present disclosure, there is provided a shower head electrode assembly of a plasma processing apparatus, comprising: an electrode having a plurality of first gas flow paths and having a surface exposed to plasma; and a backing member attached to the electrode and having a plurality of second gas flow paths which communicate with the plurality of first gas flow paths. Each of the plurality of second gas flow paths is a slit-shaped elongated hole, and is configured such that a length of the elongated hole in radial direction is longer than a length of the elongated hole in circumferential direction with respect to a central axis of the shower head electrode assembly.

BRIEF DESCRIPTION OF THE DRAWINGS

FIGS. 6A to 6C are diagrams showing a modification of a configuration of a first gas flow path and a second gas flow path according to the embodiment.

DETAILED DESCRIPTION

Figure 1:
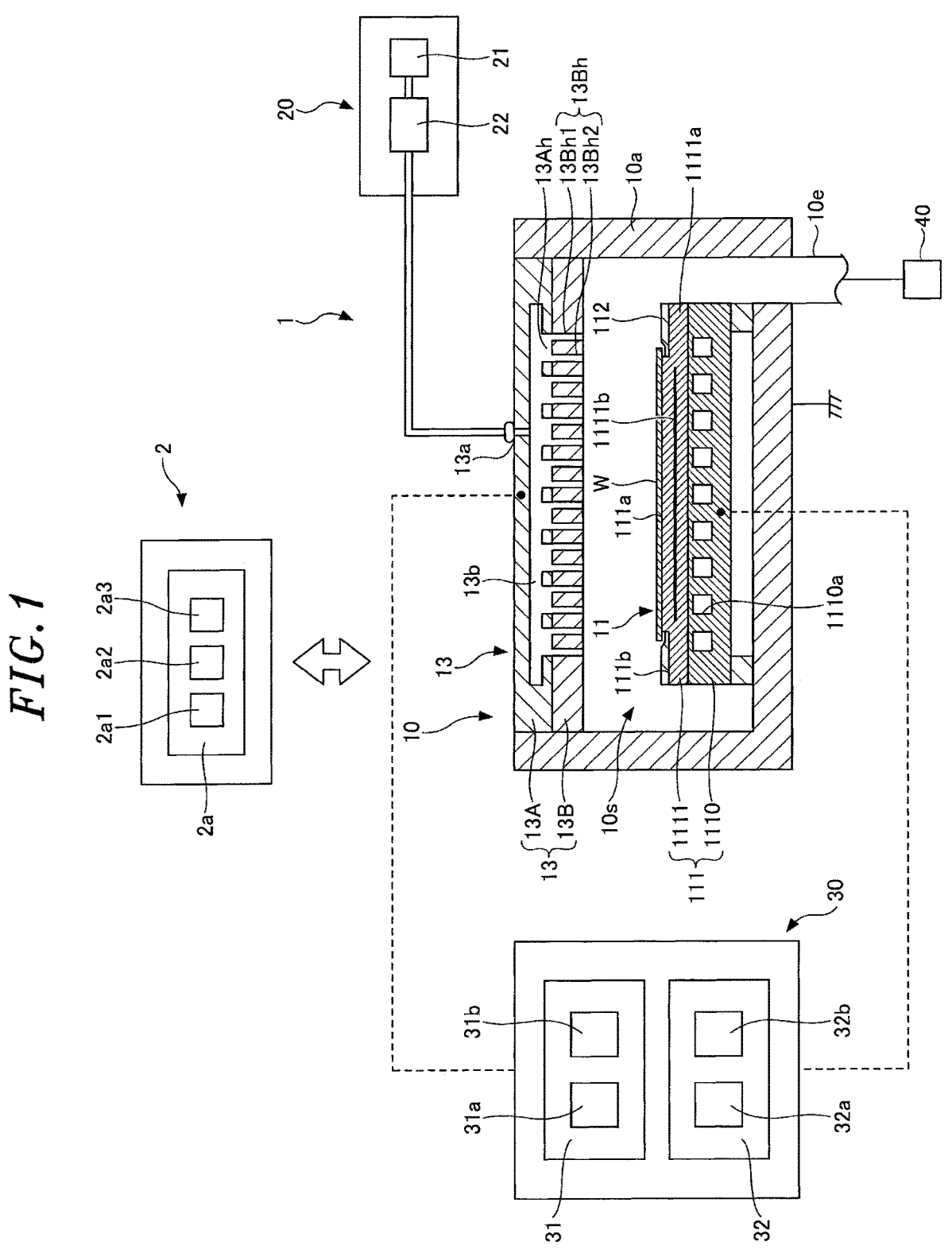
FIG. 1 is a diagram showing a configuration example of a plasma processing system according to an embodiment.

Hereinafter, embodiments for carrying out the present disclosure will be described with reference to the drawings. In each drawing, the same components are denoted by the same reference numerals, and redundant description thereof may be omitted.

In the present specification, deviation is allowed in parallel, perpendicular, orthogonal, horizontal, vertical, up-down, left-right directions, etc., to the extent that the effects of the embodiments are not impaired. A shape of a corner is not limited to a right angle, and may be arcuately rounded. Parallel, perpendicular, orthogonal, horizontal, vertical, and circular may include substantially parallel, substantially perpendicular, substantially orthogonal, substantially horizontal, substantially vertical, and substantially circular.

Hereinafter, a configuration example of a plasma processing system will be described. FIG. 1 is a diagram for explaining a configuration example of a capacitively coupled plasma processing apparatus.

The plasma processing system includes a capacitively coupled plasma processing apparatus 1 and a controller 2. The capacitively coupled plasma processing apparatus 1 includes a plasma processing chamber 10, a gas supply 20, a power supply 30, and an exhaust system 40. Further, the plasma processing apparatus 1 includes a substrate support 11 and a gas introduction portion. The gas introduction portion is configured to introduce at least one processing gas into the plasma processing chamber 10. The gas introduction portion includes a shower head 13. The substrate support 11 is disposed in the plasma processing chamber 10. The shower head 13 is disposed above the substrate support 11. In one embodiment, the shower head 13 forms at least a part of a ceiling of the plasma processing chamber 10. The plasma processing chamber 10 has a plasma processing space 10s defined by the shower head 13, sidewalls 10a of the plasma processing chamber 10, and the substrate support 11. The plasma processing chamber 10 has at least one gas supply port for supplying at least one processing gas to the plasma processing space 10s and at least one gas exhaust port for exhausting gas from the plasma processing space. The plasma processing chamber 10 is grounded. The shower head 13 and the substrate support 11 are electrically insulated from a housing of the plasma processing chamber 10.

The substrate support 11 includes a body portion 111 and a ring assembly 112. The body portion 111 has a central region 111a for supporting a substrate W and an annular region 111b for supporting the ring assembly 112. A wafer is an example of the substrate W. The annular region 111b of the body portion 111 surrounds the central region 111a of the body portion 111 in plan view. The substrate W is disposed on the central region 111a of the body portion 111, and the ring assembly 112 is disposed on the annular region 111b of the body portion 111 so as to surround the substrate W on the central region 111a of the body portion 111. Therefore, the central region 111a is also referred to as a substrate support surface for supporting the substrate W, and the annular region 111b is also referred to as a ring support surface for supporting the ring assembly 112.

In one embodiment, the body portion 111 includes a base 1110 and an electrostatic chuck 1111. The base 1110 includes a conductive member. The conductive member of the base 1110 can serve as a lower electrode. The electrostatic chuck 1111 is disposed on the base 1110. The electrostatic chuck 1111 includes a ceramic member 1111*a* and an electrostatic electrode 1111*b* disposed in the ceramic member 1111*a*. The ceramic member 1111*a* has the central region 111*a*. In one embodiment, the ceramic member 1111*a* also has the annular region 111*b*. Another member surrounding the electrostatic chuck 1111, such as an annular electrostatic chuck or an annular insulating member, may have the annular region 111*b*. In this case, the ring assembly 112 may be disposed on the annular electrostatic chuck or the annular insulating member, or may be disposed on both the electrostatic chuck 1111 and the annular insulating member. Further, at least one RF/DC electrode coupled to a radio frequency (RF) power supply 31 and/or a direct current (DC) power supply 32, which will be described later, may be disposed in the ceramic member 1111*a*. In this case, at least one RF/DC electrode serves as the lower electrode. If a bias RF signal and/or a DC signal, described below, is applied to at least one RF/DC electrode, the RF/DC electrode is also referred to as a bias electrode. Further, the conductive member of the base 1110 and at least one RF/DC electrode may serve as a plurality of lower electrodes. Further, the electrostatic electrode 1111*b* may serve as the lower electrode. Therefore, the substrate support 11 includes at least one lower electrode.

The ring assembly 112 includes one or more annular members. In one embodiment, the one or more annular members include one or more edge rings and at least one cover ring. The edge ring is made of a conductive material or an insulating material, and the cover ring is made of an insulating material.

Further, the substrate support 11 may include a temperature control module configured to control at least one of the electrostatic chuck 1111, the ring assembly 112, and the substrate to a target temperature. The temperature control module may include a heater, a heat transfer medium, a flow path 1110*a*, or a combination thereof. Through the flow path 1110*a*, a heat transfer fluid such as brine or gas flows. In one embodiment, the flow path 1110*a* is formed in the base 1110 and one or more heaters are disposed in the ceramic member 1111*a* of the electrostatic chuck 1111. Further, the substrate support 11 may include a heat transfer gas supply configured to supply a heat transfer gas to a gap between a back surface of the substrate W and the central region 111*a*.

The shower head 13 is configured to introduce at least one processing gas from the gas supply 20 into the plasma processing space 10*s*. The shower head 13 includes at least one gas supply port 13*a*, at least one gas diffusion chamber 13*b*, and a plurality of gas flow paths.

The shower head 13 has an upper electrode 13B having a surface exposed to plasma, and a backing member 13A attached to the upper electrode 13B from a back surface side of the upper electrode 13B. The upper electrode 13B and the backing member 13A are disk-shaped. The upper electrode 13B has a plurality of first gas flow paths 13Bh1 and 13Bh2. The backing member 13A has a plurality of second gas flow paths 13Ah. Specifically, two first gas flow paths 13Bh1 and 13Bh2 communicate with one second gas flow path 13Ah. The first gas flow paths 13Bh1 and 13Bh2 are also collectively referred to as a first gas flow path 13Bh. For example, the backing member 13A may be formed with a flow path through which a heat transfer fluid such as brine or gas flows, and may have a function of cooling the shower head 13. The backing member 13A is also referred to as a cooling plate.

The processing gas supplied to the gas supply port 13*a* passes through the gas diffusion chamber 13*b*, passes through the plurality of second gas flow paths 13Ah and the plurality of first gas flow paths 13Bh, and is introduced into the plasma processing space 10*s*. In addition to the shower head 13, the gas introduction portion may include one or more side gas injectors (SGI) attached to one or more openings formed in the sidewall 10*a*.

The gas supply 20 may include at least one gas source 21 and at least one flow controllers 22. In one embodiment, the gas supply 20 is configured to supply at least one processing gas to the shower head 13 from respective gas sources 21 through respective flow controllers 22. Each flow controller 22 may include, for example, a mass-flow controller or a pressure controlled flow controller. Further, the gas supply 20 may include one or more flow modulation devices which modulate or pulse the flow rate of at least one processing gas.

The power supply 30 includes the RF power supply 31 coupled to the plasma processing chamber 10 via at least one impedance matching circuit. The RF power supply 31 is configured to supply at least one RF signal (RF power) to at least one lower electrode and/or at least one upper electrode. Therefore, plasma is formed from at least one processing gas supplied to the plasma processing space 10*s*. Therefore, the RF power supply 31 may serve as at least a part of a plasma generating portion configured to generate plasma from one or more processing gases in the plasma processing chamber 10. Further, by supplying a bias RF signal to at least one lower electrode, a bias potential is generated in the substrate W, and ion components in the formed plasma can be drawn into the substrate W.

In one embodiment, the RF power supply 31 includes a first RF generating portion 31*a* and a second RF generating portion 31*b*. The first RF generating portion 31*a* is coupled to at least one lower electrode and/or at least one upper electrode via at least one impedance matching circuit, and configured to generate a source RF signal (source RF power) for plasma generation. In one embodiment, the source RF signal has a frequency within a range of 10 MHz to 150 MHz. In one embodiment, the first RF generating portion 31*a* may be configured to generate a plurality of source RF signals having different frequencies. The generated one or more source RF signals are supplied to at least one lower electrode and/or at least one upper electrode.

The second RF generating portion 31*b* is coupled to at least one lower electrode via at least one impedance matching circuit, and configured to generate a bias RF signal (bias RF power). The frequency of the bias RF signal may be the same as or different from the frequency of the source RF signal. In one embodiment, the bias RF signal has a frequency lower than the frequency of the source RF signal. In one embodiment, the bias RF signal has a frequency in a range of 100 kHz to 60 MHz. In one embodiment, the second RF generating portion 31*b* may be configured to generate a plurality of bias RF signals having different frequencies. The generated one or more bias RF signals are supplied to at least one lower electrode. Further, in various embodiments, at least one of the source RF signal and the bias RF signal may be pulsed.

Further, the power supply 30 may include the DC power supply 32 coupled to the plasma processing chamber 10. The DC power supply 32 includes a first DC generating portion 32*a* and a second DC generating portion 32*b*. In one embodiment, the first DC generating portion 32*a* is connected to at least one lower electrode and configured to generate a first DC signal. The generated first DC signal is applied to at least one lower electrode. In one embodiment, the second DC generating portion 32*b* is connected to at least one upper electrode and configured to generate a second DC signal. The generated second DC signal is applied to at least one upper electrode.

In various embodiments, at least one of the first and second DC signals may be pulsed. In this case, a sequence of voltage pulses is applied to at least one lower electrode and/or at least one upper electrode. The voltage pulses may have rectangular waveforms, trapezoidal waveforms, triangular waveforms, or a combination thereof. In one embodiment, a waveform generating portion for generating a sequence of voltage pulses from a DC signal is connected between the first DC generating portion 32a and at least one lower electrode. Therefore, the first DC generating portion 32a and the waveform generating portion constitute a voltage pulse generating portion. When the second DC generating portion 32b and the waveform generating portion constitute the voltage pulse generating portion, the voltage pulse generating portion is connected to at least one upper electrode. The voltage pulses may have a positive polarity or a negative polarity. Further, the sequence of voltage pulses may include one or more positive voltage pulses and one or more negative voltage pulses in one cycle. The first and second DC generating portions 32a and 32b may be provided in addition to the RF power supply 31, and the first DC generating portion 32a may be provided instead of the second RF generating portion 31b.

The exhaust system 40 may be connected to a gas outlet 10e provided at a bottom of the plasma processing chamber 10, for example. The exhaust system 40 may include a pressure regulating valve and a vacuum pump. Pressure in the plasma processing space 10s is regulated by the pressure regulating valve. The vacuum pump may include a turbomolecular pump, a dry pump, or a combination thereof.

The controller 2 processes computer-executable instructions which cause the plasma processing apparatus 1 to perform various steps described in the present disclosure. The controller 2 may be configured to control each component of the plasma processing apparatus 1 to perform various processes described herein. In one embodiment, part or all of the controller 2 may be included in the plasma processing apparatus 1. The controller 2 may include a processor 2a1, a storage 2a2, and a communication interface 2a3. The controller 2 is implemented by, for example, a computer 2a. The processor 2a1 may be configured to perform various control operations by reading a program from the storage 2a2 and executing the read program. This program may be stored in the storage 2a2 in advance, or may be acquired via a medium when necessary. The acquired program is stored in the storage 2a2, and read from the storage 2a2 and executed by the processor 2a1. The medium may be various storage media readable by the computer 2a, or may be a communication line connected to the communication interface 2a3. The processor 2a1 may be a central processing unit (CPU). The storage 2a2 may include a random access memory (RAM), a read only memory (ROM), a hard disk drive (HDD), a solid state drive (SSD), or a combination thereof. The communication interface 2a3 may communicate with the plasma processing apparatus 1 via a communication line such as a local area network (LAN).

[Shower Head]

Figure 2A:
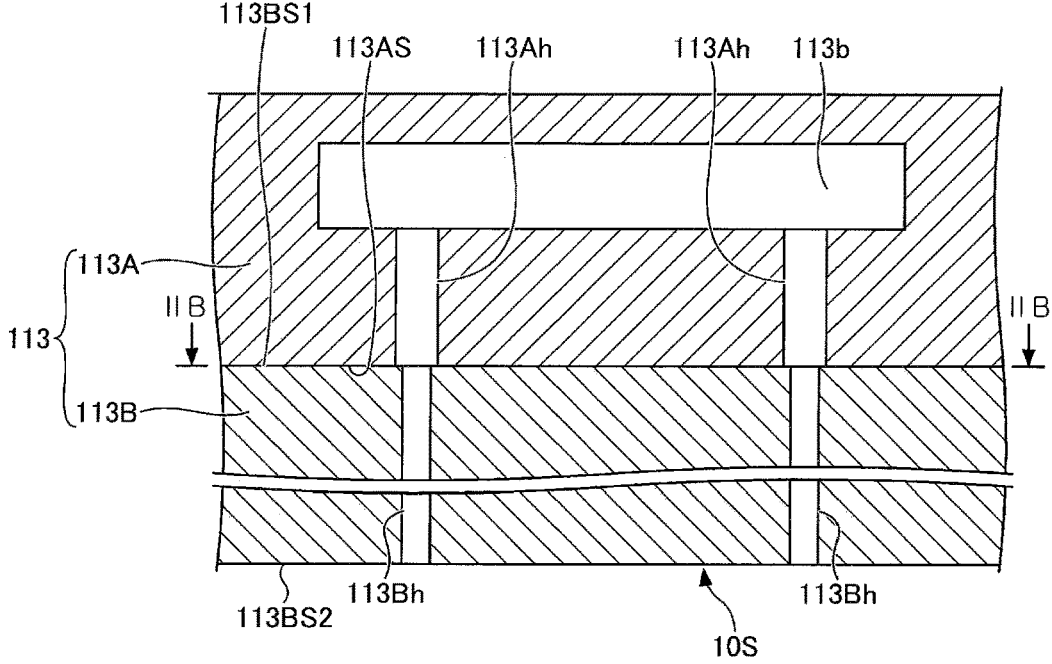
FIGS. 2A and 2B are longitudinal cross-sectional views enlarging a part of a shower head according to a reference example.
Figure 2B:
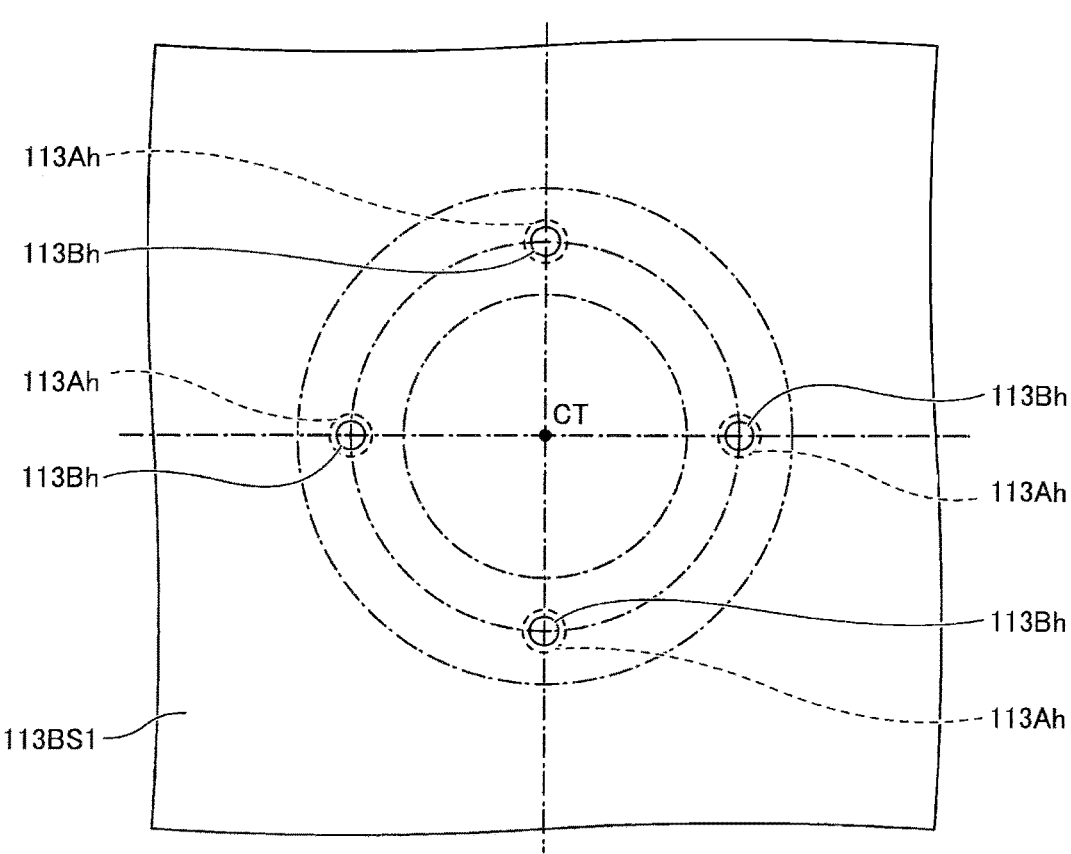
Figure 3A:
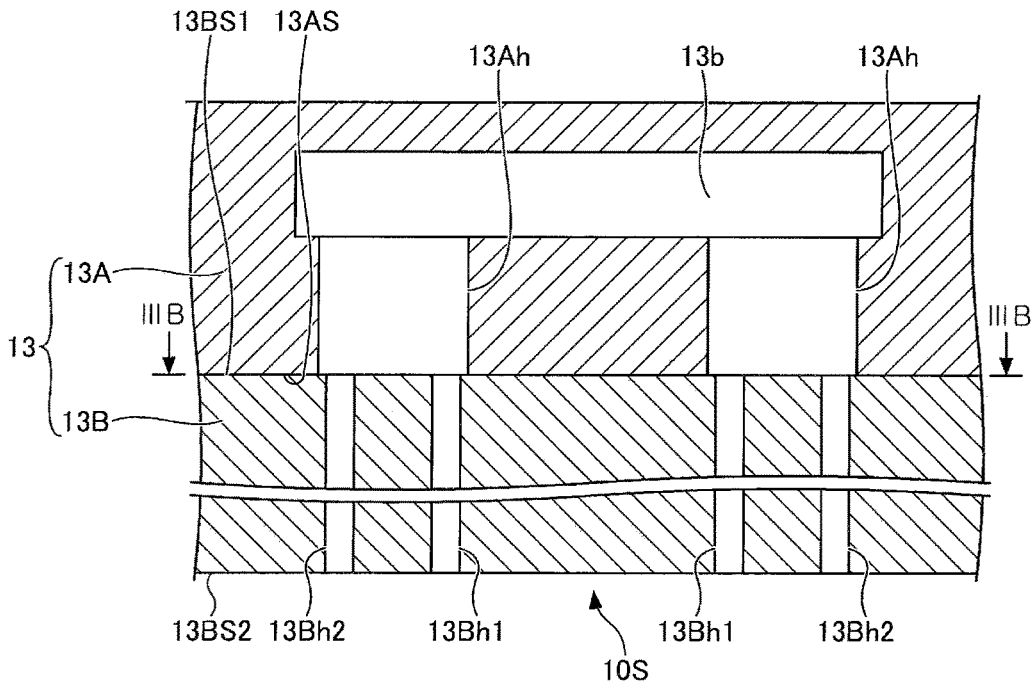
FIGS. 3A and 3B are longitudinal cross-sectional views enlarging a part of a shower head according to the embodiment.
Figure 3B:
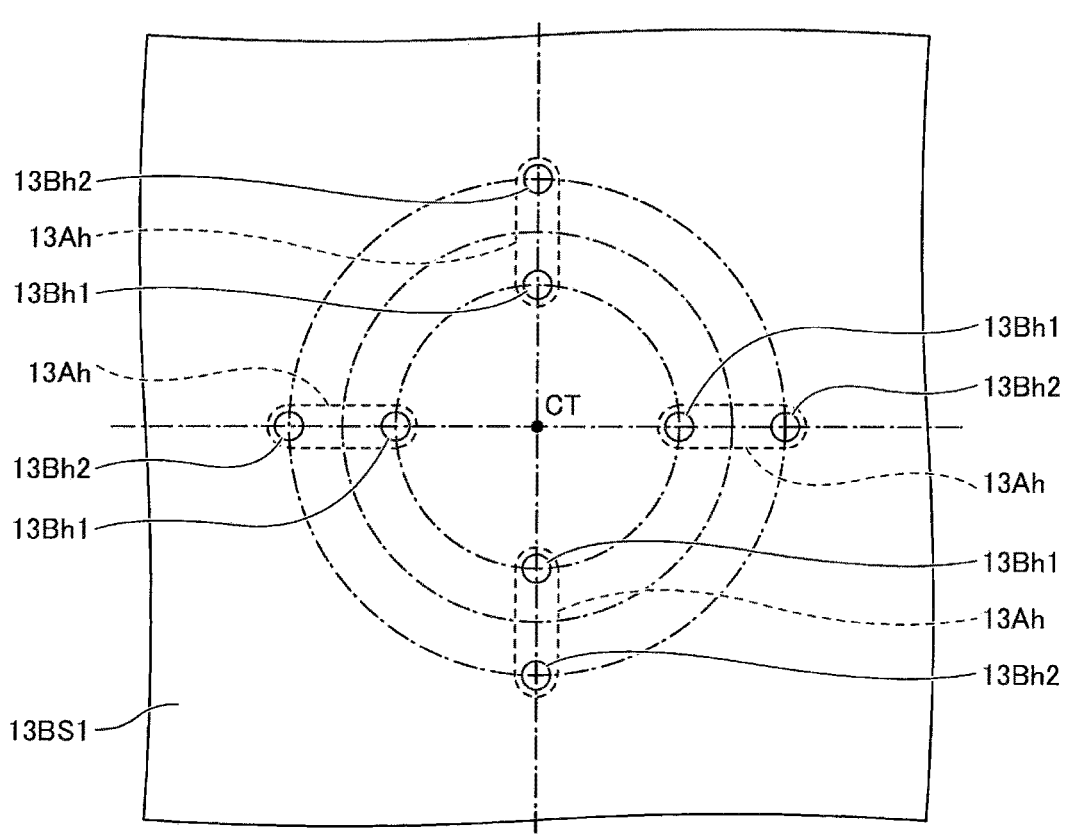

Next, a configuration of the shower head (shower head electrode assembly) 13 according to the embodiment will be described in comparison with a shower head 113 according to a reference example. FIG. 2A is a longitudinal cross-sectional view enlarging a part of the shower head 113 according to the reference example, and FIG. 2B is a plan view of a part of a back surface of a upper electrode 113B taken from the plane IIB-IIB of FIG. 2A. FIG. 3A is a longitudinal cross-sectional view enlarging a part of the shower head 13 according to the embodiment, and FIG. 3B is a plan view of a part of the back surface of the upper electrode 13B from the plane IIIB-IIIB of FIG. 3A.

REFERENCE EXAMPLE

The shower head 113 according to the reference example shown in FIGS. 2A and 2B has the upper electrode 113B having a front surface 113BS2 and a back surface 113BS1 which is an opposite surface thereto, and a backing member 113A having a support surface 113AS and attached to the upper electrode 113B. The support surface 113AS is a lower surface of the backing member 113A and contacts the back surface (upper surface) 113BS1 of the upper electrode 113B. The front surface 113BS2 is a lower surface of the upper electrode 113B and is exposed to plasma.

In the shower head 113, a plurality of first gas flow paths 113Bh and a plurality of second gas flow paths 113Ah communicate vertically and are provided on a plurality of concentric circles. FIG. 2B, which is a plan view taken from the plane IIB-IIB of FIG. 2A, shows the gas flow paths when the back surface 113BS1 side is viewed from a boundary between the support surface 113AS and the back surface 113BS1, and shows part of the gas flow paths provided on the plurality of concentric circles. Four first gas flow paths 113Bh and four second gas flow paths 113Ah provided on the concentric circle (on the same circumference) with respect to a center CT shown in FIG. 2B will be described below as an example. The center CT is a point through which a central axis of the shower head 113 passes, and a central axis of the disk-shaped upper electrode 113B and the backing member 113A is common to the central axis of the shower head 113.

The backing member 113A is made of, for example, aluminum and has an alumite-treated surface, thereby having plasma resistance. The backing member 113A has the plurality of second gas flow paths 113Ah for supplying gas from the gas diffusion chamber 113b to the support surface 113AS. The processing gas introduced into the gas diffusion chamber 113b passes through the plurality of second gas flow paths 113Ah and is discharged toward the upper electrode 113B. That is, the processing gas flows through the plurality of second gas flow paths 113Ah. Each of the plurality of second gas flow paths 113Ah is a round hole.

The upper electrode 113B is an electrode that supplies high-frequency power (RF power) to the plasma processing space 10s. The upper electrode 113B is made of, for example, silicon. The front surface 113BS2 of the upper electrode 113B contacts the plasma processing space 10S and is exposed to the plasma. The upper electrode 113B has the plurality of first gas flow paths 113Bh penetrating the front surface 113BS2 and the back surface 113BS1. Each of the plurality of first gas flow paths 113Bh is a round hole.

As shown in FIG. 2B, the four first gas flow paths 113Bh and the four second gas flow paths 113Ah are provided on a concentric circle (on the same circumference) with respect to the center CT and are separated from each other at equal intervals. Each of the four second gas flow paths 113Ah is connected to each of the four first gas flow paths 113Bh on a one-to-one basis.

The shower head 113 is structured to introduce the processing gas supplied to the gas diffusion chamber 113b into the plasma processing space 10s through the plurality of second gas flow paths 13Ah and the plurality of first gas flow paths 113Bh.

In the shower head 113 having such a structure, abnormal discharge may occur near the boundary between the upper electrode 113B and the backing member 113A. That is, the pressure of the processing gas may not be sufficiently lowered due to decrease in conductance in the first gas flow path 113Bh formed on the back surface 113BS1 of the upper electrode 113B and/or in the second gas flow path 113Ah formed on the support surface 113AS of the backing member 113A. At this time, the abnormal discharge occurs inside the shower head 113, i.e., inside the second gas flow path 113Ah and/or the first gas flow path 113Bh. Therefore, the upper electrode 113B and/or the backing member 113A may be damaged or consumed, or the supply of the processing gas may be disturbed.

EMBODIMENT

On the other hand, the shower head 13 according to the present embodiment increases the conductance in the first gas flow path 13Bh and the second gas flow path 13Ah at the boundary between the upper electrode 13B and the backing member 13A to sufficiently lower the pressure of the processing gas. This prevents the abnormal discharge from occurring inside the shower head 13, i.e., inside the first gas flow path 13Bh and the second gas flow path 13Ah. A configuration example of the shower head 13 according to the present embodiment will be described with reference to FIGS. 3A and 3B.

The shower head 13 according to the present embodiment has the upper electrode 13B having a front surface 13BS2 and a back surface 13BS1 which is an opposite surface thereto, and the backing member 13A having a support surface 13AS and attached to the upper electrode 13B. The support surface 13AS is a lower surface of the backing member 13A and contacts the back surface (upper surface) 13BS1 of the upper electrode 13B. The front surface 13BS2 is a lower surface of the upper electrode 13B and is exposed to the plasma.

In the shower head 13, the plurality of first gas flow paths 13Bh1 and 13Bh2 and the plurality of second gas flow paths 13Ah communicate vertically and are provided on a plurality of concentric circles. FIG. 3B, which is a plan view taken from the plane IIIB-IIIB of FIG. 3A, shows gas flow paths when the back surface 13BS1 side is viewed from a boundary between the support surface 13AS and the back surface 13BS1, and shows part of the gas flow paths provided on the plurality of concentric circles. Eight first gas flow paths 13Bh1 and 13Bh2 and four second gas flow paths 13Ah provided concentrically with respect to the center CT shown in FIG. 3B will be described below as an example. The center CT is a point through which the central axis of the shower head 13 passes, and the central axis of the disk-shaped upper electrode 13B and the backing member 13A is common to the central axis of the shower head 13.

The backing member 13A is made of, for example, aluminum and has an alumite-treated surface, thereby having plasma resistance. The backing member 13A has the plurality of second gas flow paths 13Ah for supplying gas from the gas diffusion chamber 13b to the support surface 13AS. The processing gas introduced into the gas diffusion chamber 13b passes through the plurality of second gas flow paths 13Ah and is discharged toward the upper electrode 13B. That is, the processing gas flows through the plurality of second gas flow paths 13Ah. Each of the plurality of second gas flow paths 13Ah is an elongated hole extending in the radial direction with respect to the center CT. In other words, each of the plurality of second gas flow paths 13Ah is configured such that the length in the radial direction is longer than the length in the circumferential direction with respect to the center CT.

The upper electrode 13B is an electrode that supplies high-frequency power (RF power) to the plasma processing space 10s. The upper electrode 13B is made of, for example, silicon. The back surface 13BS1 of the upper electrode 13B contacts the backing member 13A. The front surface 13BS2 of the upper electrode 13B is in contact with the plasma processing space 10s. That is, the front surface 13BS2 of the upper electrode 13B forms the inner surface of the plasma processing space 10s and is exposed to the plasma. The upper electrode 13B has the plurality of first gas flow paths 13Bh1 and 13Bh2 penetrating the front surface 13BS2 and the back surface 13BS1. Each of the plurality of first gas flow paths 13Bh1 and 13Bh2 is a round hole.

As shown in FIG. 3B, four first gas flow paths 13Bh1 and four first gas flow paths 13Bh2 are provided on concentric circles with respect to the center CT and are separated from each other at equal intervals. Each of the four second gas flow paths 13Ah is connected to each of the eight first gas flow paths 13Bh1 and 13Bh2 on a one-to-two basis. That is, two first gas flow paths 13Bh1 and 13Bh2 are connected to one second gas flow path 13Ah. Therefore, when one second gas flow path 13Ah and two first gas flow paths 13Bh1 and 13Bh2 form one group, four groups (four second gas flow paths 13Ah and eight first gas flow paths 13Bh1 and 13Bh2) are provided spaced apart from each other.

Figure 4A:
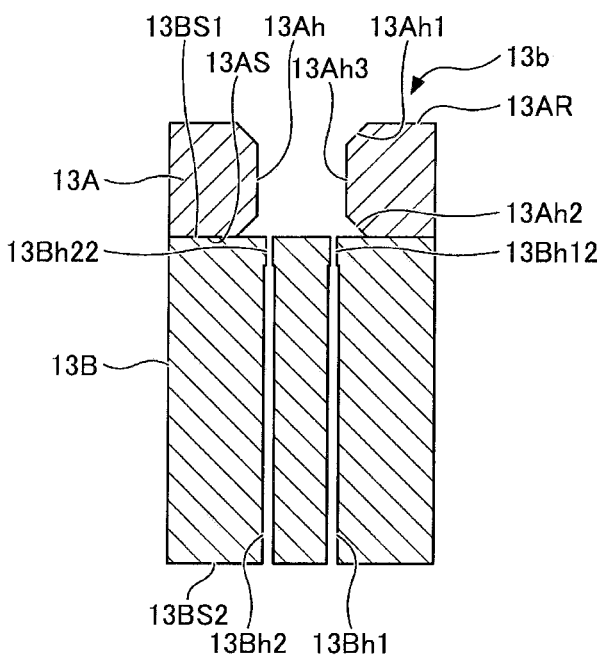
FIGS. 4A and 4B are longitudinal cross-sectional views enlarging a part of a gas flow path according to the embodiment.
Figure 4B:
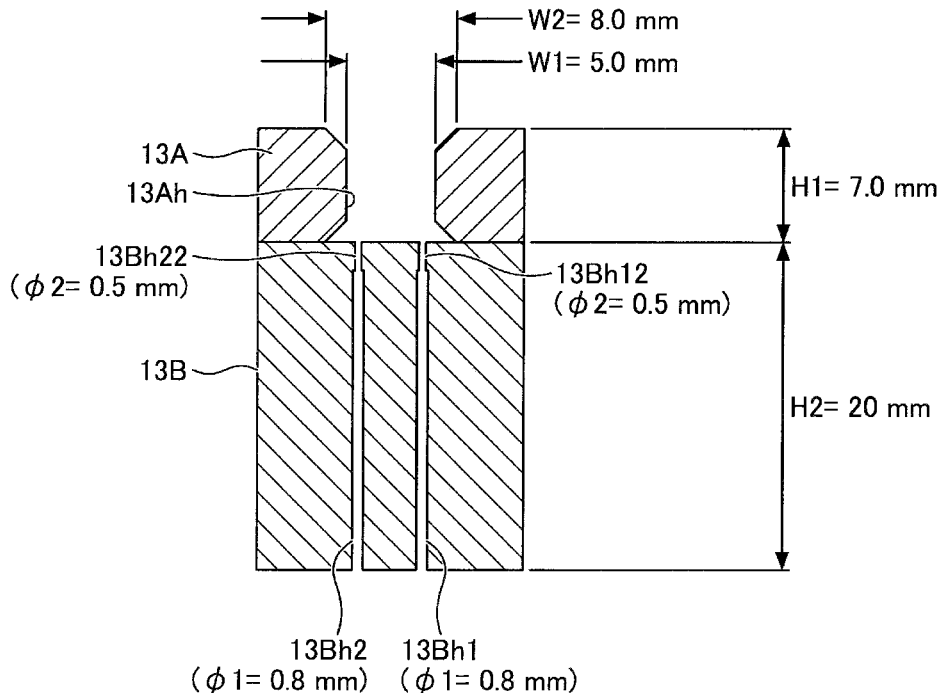

FIGS. 4A and 4B are longitudinal cross-sectional views showing further enlarged gas flow paths below the gas diffusion chamber 13b of FIG. 3A. FIG. 4B shows dimensions of the gas flow paths shown in FIG. 4A. FIGS. 4A and 4B are cross-sectional views taken along line IV-IV of FIG. 5A, which will be described later.

The first gas flow paths 13Bh1 and 13Bh2 of the upper electrode 13B pass through the back surface 13BS1 and the front surface 13BS2 and communicate with the bottom of the second gas flow path 13Ah. Each of the first gas flow paths 13Bh1 and 13Bh2 has narrowed portions 13Bh12 and 13Bh22 at a connection portion (lower side of the bottom) with the second gas flow path 13Ah. Even when the front surface 13BS2 of the upper electrode 13B is exposed to the plasma and worn out, the pressure on an outlet side (front surface 13BS2 side) of the first gas flow paths 13Bh1 and 13Bh2 can be made substantially constant by the narrowed portions 13Bh12 and 13Bh22.

The first gas flow paths 13Bh1 and 13Bh2 are arranged side by side in the longitudinal direction of the second gas flow path 13Ah, which is an elongated hole. The first gas flow paths 13Bh1 and 13Bh2 are respectively provided at positions extending in the vertical direction along longitudinal side surface 13Ah3 of the second gas flow path 13Ah.

Figure 5A:
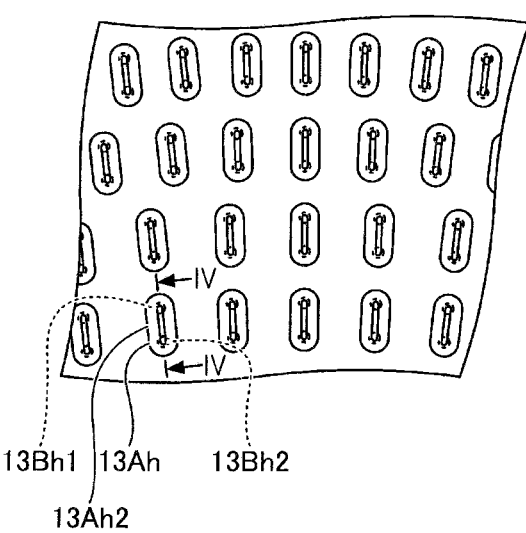
FIGS. 5A and 5B are diagrams showing a part of a support surface of a backing member according to the embodiment.
Figure 5B:
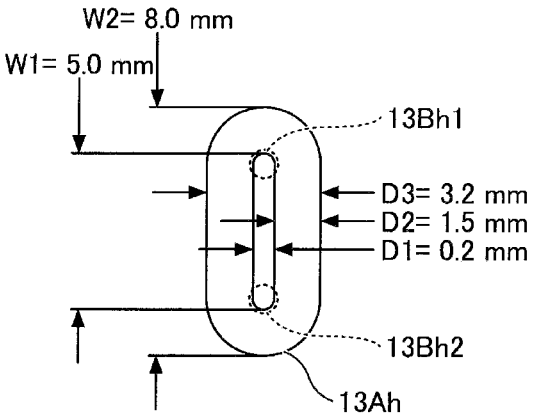

FIG. 5A is a plan view of a part of the support surface 13AS of the backing member 13A according to the embodiment and FIG. 5B is an enlarged view of one of the second gas flow paths 13Ah shown in FIG. 5A. As shown in FIG. 5A, each of the plurality of second gas flow paths 13Ah is a slit-shaped elongated hole, and is configured such that the length of the elongated hole in the radial direction is longer than the length in the circumferential direction with respect to the central axis of the shower head 13. FIG. 5A shows the second gas flow paths 13Ah disposed on a first circumference, a second circumference, a third circumference, a fourth circumference, and so on in the circumferential direction. All imaginary lines passing through both longitudinal ends of the elongated hole of the second gas flow path 13Ah pass through the center CT (see FIG. 3B). The intervals between the elongated holes on the same circumference are equal to each other, and the intervals between the elongated holes on different circumferences become narrower as the distance from the center CT increases.

As shown in FIGS. 4A and 4B, the second gas flow path 13Ah is chamfered at an opening of a boundary surface 13AR (surface opposite to the support surface 13AS) of the backing member 13A with the gas diffusion chamber 13b, and at the support surface 13AS. The chamfered portions are inclined surfaces 13Ah1 and 13Ah2 that are inclined outward with respect to the side surface 13Ah3 of the second gas flow path 13Ah. The chamfered portion is formed over the entire circumference. In the second gas flow path 13Ah, the outer edge of the elongated hole, i.e., the outer circumference of the chamfered inclined surfaces 13Ah1 and 13Ah2 has a substantially elliptical shape. Further, in each of the second gas flow paths 13Ah, the inner edge of the elongated hole in plan view, i.e., a portion surrounded by the side surface 13Ah3 of the second gas flow path 13Ah has an elongated slit shape.

Although the chamfered portions are shown as flat inclined surfaces 13Ah1 and 13Ah2 in FIGS. 4A and 4B, the inclined surfaces 13Ah1 and 13Ah2 may have a curved surface curved outward. Therefore, an opening of the elongated hole of the second gas flow path 13Ah has no corners and has a gradual surface, thereby further suppressing occurrence of the abnormal discharge in the second gas flow path 13Ah. As a secondary effect, the alumite treatment (surface processing) of the backing member 13A can be facilitated by eliminating the corners.

As shown in FIG. 4B, the diameter φ1 of the first gas flow paths 13Bh1 and 13Bh2 is, for example, 0.8 mm and the diameter 2 of the narrowed portions 13Bh12 and 13Bh22 is, for example, 0.5 mm.

The thickness H1 of the backing member 13A is 7.0 mm and the thickness H2 of the upper electrode 13B is 20 mm. The length of the narrowed portions 13Bh12 and 13Bh22 is about ¹⁄₁₀ of the total length of 20 mm of the first gas flow paths 13Bh1 and 13Bh2 including the narrowed portions 13Bh12 and 13Bh22.

As shown in FIGS. 4B and 5B, the longitudinal width W1 of the inner edge of the elongated hole of the second gas flow path 13Ah is 5.0 mm, and the longitudinal width W2 of the outer edge of the elongated hole is 8.0 mm. The transverse width D1 of the inner edge of the elongated hole of the second gas flow path 13Ah is 0.2 mm, and the transverse width D3 of the outer edge of the elongated hole is 3.2 mm. The width D2 of the chamfered portion is 1.5 mm in plan view. The amount of chamfering in the radial direction and the amount of chamfering in the circumferential direction of the elongated hole are the same, and are 1.5 mm in plan view. By equalizing the amount of chamfering in the radial direction and the amount of chamfering in the circumferential direction of the elongated hole, the chamfering process can be facilitated. However, the amount of chamfering in the radial direction and the amount of chamfering in the circumferential direction of the elongated hole may be different. Further, in the present embodiment, the amount of chamfering is the same over the entire circumference.

At least a part of each of the first gas flow paths 13Bh1 and 13Bh2 is disposed in a position that can be seen from the second gas flow path 13Ah in plan view. The first gas flow paths 13Bh1 and 13Bh2 are not limited to being arranged at both ends of the elongated hole of the second gas flow path

13Ah, and can be arranged side by side in the longitudinal direction of the elongated hole.

MODIFICATION

FIGS. 6A to 6C are diagrams showing a modification of the configuration of the second gas flow path 13Ah and the first gas flow path 13Bh according to the embodiment. In FIGS. 6A to 6C, the longitudinal width W1 of the inner edge of the second gas flow path 13Ah is 15 mm, and the longitudinal width W2 of the outer edge thereof is 18 mm. Other dimensions are the same as those shown in FIG. 5B. Therefore, the longitudinal width W1 of the inner edge of the second gas flow path 13Ah may be 5.0 mm or more and 15 mm or less. Further, the longitudinal width W2 of the outer edge of the second gas flow path 13Ah may be 8.0 mm or more and 18 mm or less.

By increasing the length of the second gas flow path 13Ah in the longitudinal direction, the number of first gas flow paths 13Bh which communicate with each of the second gas flow paths 13Ah can be increased. In the case of FIG. 6A, two first gas flow paths 13Bh1 and 13Bh2 are communicated with one second gas flow path 13Ah. In the case of FIG. 6B, four first gas flow paths 13Bh1 to 13Bh4 are communicated with one second gas flow path 13Ah. In the case of FIG. 6C, seven first gas flow paths 13Bh1 to 13Bh7 are communicated with one second gas flow path 13Ah. The diameter φ of the first gas flow paths 13Bh1 to 13Bh7 is 0.5 mm.

In the shower head 13 described above, the processing gas supplied to the gas diffusion chamber 13b passes through the second gas flow path 13Ah. The processing gas branches and flows into two or more first gas flow paths 13Bh communicating with the bottom surface of the second gas flow path 13Ah. This increases the conductance in the first gas flow path 113Bh and the second gas flow path 13Ah at the boundary between the backing member 13A and the upper electrode 13B, thereby sufficiently reducing the pressure of the processing gas. As a result, it is possible to prevent the abnormal discharge from occurring inside the shower head 13, i.e., inside the first gas flow path 13Bh and the second gas flow path 13Ah.

[Simulation Result]

Figure 7A:
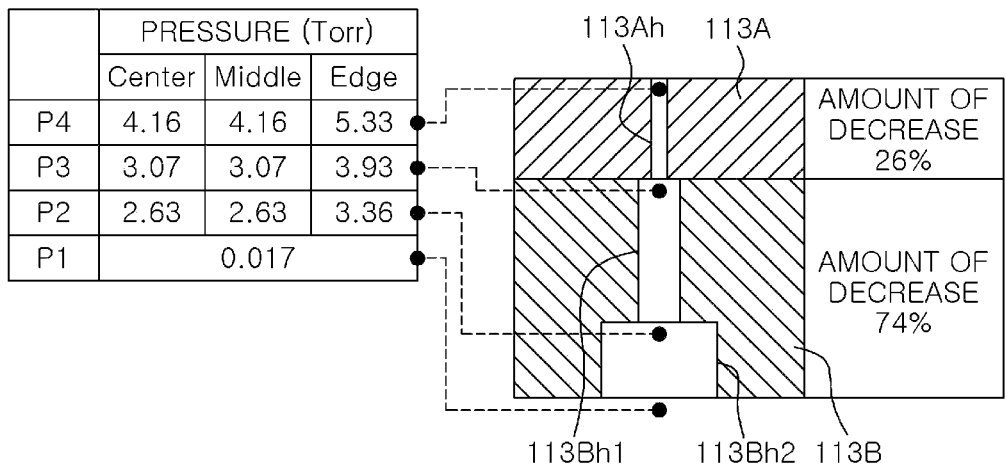
FIGS. 7A and 7B are diagrams showing an example of a simulation result for an amount of decrease in pressure of a processing gas according to the embodiment.
Figure 7B:
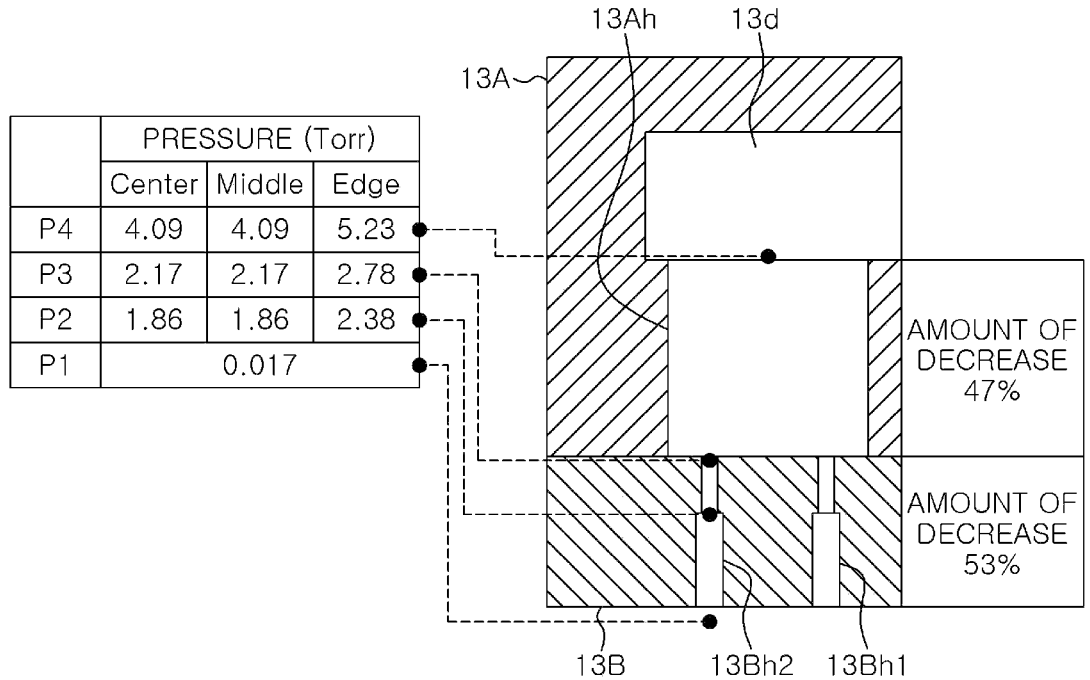

A simulation was performed on the amount of decrease in the pressure of the processing gas in the first gas flow path 13Bh and the second gas flow path 13Ah. FIGS. 7A and 7B are diagrams showing a result of simulating the amount of decrease in the pressure of the processing gas according to the embodiment in comparison with the reference example.

FIG. 7A shows a simulation result of the amount of decrease in the pressure of the processing gas in the reference example. In the reference example, the second gas flow path 113Ah penetrates the backing member 113A, and the first gas flow paths 113Bh1 and 113Bh2 that are vertically connected penetrate the upper electrode 113B.

The diameter of the first gas flow path 113Bh1 is larger than the diameter of the second gas flow path 113Ah, and the diameter of the first gas flow path 113Bh2 is larger than the diameter of the first gas flow path 113Bh1. That is, the first gas flow path 113Bh2 expands in diameter from the first gas flow path 113Bh1 and opens to the plasma processing space 10s.

FIG. 7B shows a simulation result of the amount of decrease in the pressure of the processing gas in the gas flow path in a configuration in which branching into two first gas flow paths 13Bh1 and 13Bh2 is performed at the bottom surface of the second gas flow path 13Ah according to the present embodiment described with reference to FIGS. 3 and 4.

In both FIGS. 7A and 7B, the pressure in the plasma processing chamber 10 was set at 17 mTorr (2.27 Pa). A total flow rate of the gas to be supplied was about 600 sccm, and the number of gas flow paths (gas holes) was 1000. In the present embodiment, about 1000 second gas flow paths 13Ah, 1000 first gas flow paths 13Bh1, and 1000 first gas flow paths 13Bh2 are provided. In the present embodiment, 2000 holes are opened in the plasma processing space 10s. On the other hand, in the reference example, about 1000 circular holes formed by the second gas flow path 113Ah and the first gas flow paths 13Bh1 and 13Bh2 communicating vertically are provided. In the reference example, 1000 holes are opened in the plasma processing space 10s.

Simulation results of the pressures P1 to P4 of the processing gas are shown in the Tables of FIGS. 7A and 7B. In the reference example, the pressure P1 of the processing gas at the outlet of the first gas flow path 113Bh2, the pressure P2 at the inlet of the first gas flow path 113Bh2, the pressure P3 of the first gas flow path 113Bh1 at the boundary between the backing member 113A and the upper electrode 113B, and the pressure P4 at the inlet of the second gas flow path 113Ah were calculated. For the pressures P2 to P4 other than the pressure P1, the pressures at a center, a middle, and an edge of each gas flow path were calculated.

In the present embodiment, the pressure P1 of the processing gas at the outlet of the first gas flow paths 13Bh1 and 13Bh2, the pressure P2 at the outlet of the narrowed portion, the pressure P3 of the first gas flow paths 13Bh1 and 13Bh2 at the boundary between the backing member 13A and the upper electrode 13B, and the pressure P4 at the inlet of the second gas flow path 13Ah were calculated. For the pressures P2 to P4 other than the pressure P1, the pressures at a center, a middle, and an edge of each gas flow path were calculated.

As a result, in the reference example, when the pressure at the inlet of the second gas flow path 113Ah is 100% (total pressure), the amount of decrease in the total pressure along the second gas flow path 113Ah is 26%, and the amount of decrease in the total pressure along the first gas flow path 113Bh (the first gas flow paths 113Bh1 and 113Bh2) is 74%. All of the center, the middle, and the edge have approximately the same amount of decrease. That is, a ratio of the amount of decrease in the total pressure along the second gas flow path 113Ah to the amount of decrease in the total pressure along the first gas flow path 113Bh is 26%: 74%=0.4:1.0.

On the other hand, in the present embodiment, when the pressure at the inlet of the second gas flow path 13Ah is 100% (total pressure), the amount of decrease in the total pressure along the second gas flow path 13Ah is 47%, and the amount of decrease in the total pressure along the first gas flow path 13Bh (the first gas flow paths 13Bh1 and 13Bh2) is 53%. All of the center, the middle, and the edge have approximately the same amount of decrease. That is, a ratio of the amount of decrease in the total pressure along the second gas flow path 13Ah to the amount of decrease in the total pressure along the first gas flow path 13Bh is 47%: 53%=0.9:1.0.

Therefore, the shower head 13 according to the present embodiment can sufficiently lower the pressure of the processing gas at the boundary between the backing member 13A and the upper electrode 13B as compared with the reference example. By lowering the pressure of the processing gas, the abnormal discharge can be prevented from occurring at the boundary between the backing member 13A and the upper electrode 13B.

In the shower head 13 according to the present embodiment, the ratio of the amount of decrease in the total pressure along the second gas flow path 13Ah to the amount of decrease in the total pressure along the first gas flow path 13Bh ranges from 0.6:1.0 to 1.2:1.0. According to this, the pressure of the processing gas can be lowered at the boundary between the backing member 13A and the upper electrode 13B, and the abnormal discharge can be prevented from occurring.

However, the ratio of the amount of decrease in the total pressure along the second gas flow path 13Ah and the amount of decrease in the total pressure along the first gas flow path 13Bh is more preferably 0.8:1.0 to 1.1:1.0 and still more preferably 0.9:1.0 to 1.0:1.0. According to this, the pressure of the processing gas can be lowered at the boundary between the backing member 13A and the upper electrode 13B, and the abnormal discharge can be prevented from occurring more reliably.

As described above, according to the shower head 13 and the plasma processing apparatus 1 of the present embodiment, the abnormal discharge occurring inside the shower head 13 can be prevented.

The invention claimed is:

1. A shower head electrode assembly of a plasma processing apparatus, comprising: an electrode having a plurality of first gas flow paths and having a surface exposed to plasma; and a backing member attached to the electrode and having a plurality of second gas flow paths which communicate with the plurality of first gas flow paths, wherein each of the plurality of second gas flow paths is a slit-shaped elongated hole, each slit-shaped elongated hole has a traversed width D3 less than the circumference of the backing member, and is configured such that a length of the elongated hole in radial direction is longer than a length of the elongated hole in circumferential direction with respect to a central axis of the shower head electrode assembly, the backing member includes a support surface that contacts a back surface of the electrode and an opposite surface that is opposite to the support surface, the elongated hole is chamfered at an opening on the opposite surface of the backing member, the traversed width D3 of the slit-shaped elongated hole of each of the plurality of second gas flow paths is greater than a sum of diameters of at least two of the plurality of first gas flow paths, and the at least two of the plurality of first gas flow paths are located within the traversed width D3 of the slit-shaped elongated hole of each of the plurality of second gas flow paths.

2. The shower head electrode assembly of claim 1, wherein each of the plurality of second gas flow paths is configured to communicate with two to seven of the first gas flow paths arranged side by side in longitudinal direction of the elongated hole.

3. The shower head electrode assembly of claim 1, wherein the elongated hole is chamfered on the support surface of the backing member.

4. The shower head electrode assembly of claim 3, wherein an amount of chamfering in radial direction and an amount of chamfering in circumferential direction of the elongated hole are the same.

5. The shower head electrode assembly of claim 1, wherein a ratio of an amount of decrease in total pressure along each of the plurality of second gas flow paths to an amount of decrease in total pressure along each of the plurality of first gas flow paths is in the range of 0.6:1.0 to 1.2:1.0.

6. The shower head electrode assembly of claim 5, wherein the ratio of the amount of decrease in total pressure along each of the plurality of second gas flow paths to the amount of decrease in total pressure along each of the plurality of first gas flow paths is in the range of 0.8:1.0 to 1.1:1.0.

7. The shower head electrode assembly of claim 5, wherein the ratio of the amount of decrease in total pressure along each of the plurality of second gas flow paths to the amount of decrease in total pressure along each of the plurality of first gas flow paths is in the range of 0.9:1.0 to 1.0:1.0.

8. The shower head electrode assembly of claim 1, wherein each of the plurality of first gas flow paths has a narrowed portion at a connection portion with each of the second gas flow paths.

9. The shower head electrode assembly of claim 1, wherein in each of the plurality of second gas flow paths, a length in radial direction of an inner edge of a portion at which the elongated hole is chamfered is 5.0 mm or more and 15 mm or less.

10. The shower head electrode assembly of claim 1, wherein in each of the plurality of second gas flow paths, an outer edge of a portion at which the elongated hole is chamfered has an elliptical shape in plan view.

11. The shower head electrode assembly of claim 1, wherein at least a part of each of the plurality of first gas flow paths is arranged at a position that can be seen from the second gas flow path in plan view.

12. The shower head electrode assembly of claim 1, wherein the backing member is made of aluminum and has an alumite-treated surface.

13. The shower head electrode assembly of claim 1, wherein the electrode is made of silicon.

14. A plasma processing apparatus comprising the shower head electrode assembly according to claim 1.

15. The shower head electrode assembly of claim 1, wherein the opposite surface faces a gas diffusion chamber for supplying a processing gas through the plurality of second gas flow paths, and the elongated hole of each of the plurality of second gas flow paths is chamfered both at the opening on the opposite surface facing the gas diffusion chamber and on the support surface that contacts the back surface of the electrode.

\* \* \* \* \*